(12) United States Patent
Aoyagi et al.

(10) Patent No.: US 7,456,435 B2
(45) Date of Patent: Nov. 25, 2008

(54) LIGHT-EMITTING SEMICONDUCTOR DEVICE

(75) Inventors: Hidekazu Aoyagi, Niiza (JP); Koji Otsuka, Niiza (JP); Masahiro Sato, Niiza (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/994,922

(22) Filed: Nov. 22, 2004

(65) Prior Publication Data

US 2005/0110029 A1   May 26, 2005

(30) Foreign Application Priority Data

Nov. 26, 2003   (JP) .............................. 2003-396151

(51) Int. Cl.
*H01L 27/15* (2006.01)

(52) U.S. Cl. .............................. 257/97; 257/79; 257/94

(58) Field of Classification Search .................... 257/97, 257/13, E33.046, E33.027, E33.034, E33.033, 257/E33.028, E49.001, E49.004, 79, 94, 257/E33.01

See application file for complete search history.

(56) References Cited

U.S. PATENT DOCUMENTS

| | | | |
|---|---|---|---|
| 5,008,718 A | | 4/1991 | Fletcher et al. ............... 357/17 |
| 6,147,364 A * | | 11/2000 | Itaya et al. ..................... 257/76 |
| 6,172,382 B1 * | | 1/2001 | Nagahama et al. ............ 257/94 |
| 6,369,403 B1 * | | 4/2002 | Holonyak, Jr. ................ 257/13 |
| 6,479,836 B1 * | | 11/2002 | Suzuki et al. ................. 257/15 |
| 6,657,236 B1 * | | 12/2003 | Thibeault et al. .............. 257/98 |
| 6,995,403 B2 * | | 2/2006 | Tu et al. ......................... 257/94 |
| 7,009,215 B2 * | | 3/2006 | D'Evelyn et al. ............. 257/98 |
| 2002/0104997 A1 * | | 8/2002 | Kuo et al. ...................... 257/79 |
| 2003/0006418 A1 * | | 1/2003 | Emerson et al. ............... 257/79 |
| 2003/0178631 A1 * | | 9/2003 | Udagawa ...................... 257/99 |
| 2004/0084684 A1 * | | 5/2004 | Tarsa et al. .................... 257/91 |
| 2004/0206962 A1 * | | 10/2004 | Erchak et al. ................. 257/79 |

FOREIGN PATENT DOCUMENTS

JP   2003/197965   7/2003

OTHER PUBLICATIONS

Takeuchi et al. GaN-based Tunnel Junction in Optical Devices. Physics and Simulation of Optoelectronic Deices X, Proceeding of SPIE vol. 4646 (2002).*

* cited by examiner

*Primary Examiner*—Allan R. Wilson
(74) *Attorney, Agent, or Firm*—Woodcock Washburn LLP

(57) ABSTRACT

A light-emitting diode having a silicon substrate on which there are successively formed a buffer layer, a p-type nitride semiconductor layer, an active layer, an n-type nitride semiconductor layer, and a current spreading layer. The current spreading layer is a lamination of a first and a second sublayer arranged alternately a required number of times. Composed of different compound semiconductors, the alternating sublayers of the current spreading layer create heterojunctions for offering the two-dimensional gas effect. The current spreading layer is so low in resistivity in a direction parallel to its major surface from which light is emitted, that the current is favorably spread therein for improved efficiency of light emission. A front electrode in the form of a metal pad is mounted centrally on the major surface of the current spreading layer in ohmic contact therewith.

4 Claims, 4 Drawing Sheets

LIGHT-EMITTING SEMICONDUCTOR DEVICE

CROSS REFERENCE TO RELATED APPLICATIONS

This application claims priority to Japanese Patent Application No.2003-396151, filed Nov. 26, 2003.

BACKGROUND OF THE INVENTION

This invention relates to a light-emitting diode or like semiconductor device made from chemical compounds, particularly those of Groups III-V elements, and to a method of making such a light-emitting device.

A typical conventional compound semiconductor light-emitting device is a lamination of a baseplate of sapphire or silicon carbide or silicon, a buffer layer, an n-type semiconductor layer, an active layer, a p-type semiconductor layer, and a contact layer. Another example, taught by the U.S. Pat. No. 5,008,718 to Fletcher et al., is a lamination of a substrate, an n-type semiconductor layer, an active layer, a p-type semiconductor layer, and a current spreading layer which is also referred to as a transparent window layer.

The light generated at the active layer is emitted through the top-most contact layer or current spreading layer. An anode or top electrical contact is provided in the form of a circular metal pad mounted centrally on the surface of the contact layer or current spreading layer, leaving the rest of the surface area of the contact layer uncovered for light emission. It has also been known to mount a metal pad on the contact layer or current spreading layer via a transparent electrode.

Being impervious to light, the metal pad itself blocks the light from the corresponding part of the active layer. The current flowing in this part of the active layer was wasted, not contributing to the net efficiency of the light emitting device. It has therefore been required for higher efficiency light production to reduce the amount of current flowing in that part of the active layer which is opposed to the pad, and to increase the amount of the current, and make the current distribution more uniform, in the rest of the active layer.

A conventional attempt to meet these requirements is found in Japanese Unexamined Patent Publication No. 2003-197965, which suggests a provision of a metal annulus or rim loosely surrounding, and electrically coupled to, the metal pad on the surface of the contact layer, and of a current spreading layer between active layer and contact layer. Itself impervious to light, however, the annulus reduced by as much as 30 to 40 percent the surface area from which light was emitted, causing a corresponding drop in the efficiency of light production. Additionally, the current spreading layer was not nearly so pervious to light as could be desired, absorbing so much light as to invite a significant diminution in the efficiency of light production.

It might be contemplated to make the electrode itself pervious to light. As heretofore fabricated, however, such an electrode could pass only 70 to 90 percent of the incident light, blocking, in other words, 10 to 30 percent.

The relatively thick current spreading layer proposed by the U.S. patent cited above is also objectionable from the standpoint of maximal light emission. This layer has proved to absorb so much light as to cause a significant decrease in the efficiency of light emission.

SUMMARY OF THE INVENTION

The present invention seeks to realize a substantive improvement in the efficiency of the light-emitting device of the kind defined.

Briefly, the invention may be summarized as a light-emitting semiconductor device of improved efficiency. Included is a lamination of: (a) a first compound semiconductor layer of a first conductivity type; (b) an active layer of a compound semiconductor on the first compound semiconductor layer; (c) a transparent second compound semiconductor layer of a second conductivity type, opposite to the first conductivity type, on the active layer; and (d) a transparent current spreading layer on the second compound semiconductor layer. An electrode is electrically coupled to the current spreading layer so as to permit emission of light radiated from the active layer through the current spreading layer. Another electrode is electrically coupled to the first compound semiconductor layer.

The invention particularly features the current spreading layer in the form of a lamination of alternating first and second sublayers of different compound semiconductors. The first sublayers of the current spreading layers should be made from a compound semiconductor capable of generating therein the two-dimensional carrier layers (i.e. those of two-dimensional electron gas or hole gas) due to heterojunctions between the first and the second sublayers. The two-dimensional carrier layers provide lateral current channels extending parallel to the major surfaces of the first sublayers. Reducing the resistivity of the current spreading layer, the two-dimensional carrier layers contribute toward the greater uniformity of current distribution in the active layer.

Preferably, the second compound semiconductor layer may have a bandgap grater than that of the active layer and a thickness greater than that of each first or second current spreading sublayer. With such a thickness the second compound semiconductor layer will serve as a cladding, limiting carrier overflow. The device as a whole will improve in efficiency as the carriers are effectively contained in the active layer.

Concerning the current spreading layer, the first sublayers may have a bandgap greater than that of the active layer and be fabricated from a nitride semiconductor which may, or may not, contain aluminum. The second sublayers may also have a bandgap greater than that of the active layer and be fabricated from a nitride semiconductor containing a greater proportion of aluminum than the first sublayers possibly do. The two nitride semiconductors containing aluminum in different percentages are conducive to the creation of two-dimensional carrier layers due to heterojunctions between the first and the second current spreading sublayers.

It is recommended that the first compound semiconductor layer be of p-type conductivity, and that the second compound semiconductor layer and current spreading layer be of n-type conductivity. The n-type current spreading layer will generate two-dimensional electron gas, rather than two-dimensional hole gas, due to the heterojunctions contained therein. Higher in mobility than holes, the electrons will make the device better in response.

The invention also provides two slightly different methods of making the light emitting device of the foregoing possible constructions. According to one of the methods the first compound semiconductor layer, active layer, and second compound semiconductor layer are successively grown, in that order, on a substrate in a gaseous phase. Then the first and second sublayers of the current spreading layer are alternately grown a required number of times on the second compound semiconductor layer in a gaseous phase. The substrate serves as a mechanical support in the completed device.

The other method is such that there is first prepared what is herein termed a growth substrate, a substrate used solely for growing the required layers thereon. There is first grown in a gaseous phase on this growth substrate the current spreading layer of the alternating first and second sublayers. Then the two compound semiconductor layers with the active layer sandwiched therebetween are successively grown in a gaseous phase on the current spreading layer. Then a support substrate, different from the growth substrate, is joined to the topmost compound semiconductor layer via a bond layer of electrically conducting material. The growth substrate is removed from the current spreading layer, either before or after the bonding of the support substrate.

The first described method offers a simpler manufacturing process, demanding but one substrate for both growth and support. The second method is nevertheless advantageous in that the current spreading layer serves additionally as a buffer in gaseous phase growth of the compound semiconductor layers and active layer.

Generally, the advantages gained by the instant invention may be recapitulated as follows:

1. Constituted of several or many alternations of two sublayers of different compositions, the current spreading layer contains just as many heterojunctions adjacent of which there are created layers of two-dimensional carriers, that is those of two-dimensional electrons or holes. As a consequence, the first sublayers of the current spreading layer are very low in lateral resistivity, promoting the lateral spreading of current in the current spreading, hence the uniformity of lateral current distribution in the active layer, and, ultimately, a higher efficiency of light production by the device.

2. If the multiple heterojunction current spreading layer according to the invention is to offer the same degree of uniformity in lateral current distribution as heretofore, this layer can be significantly less in thickness than its conventional counterpart. Such a thinner current spreading layer will less hinder the passage of light therethrough and incur less power loss.

The above and other objects, features and advantages of this invention will become more apparent, and the invention itself will best be understood, from a study of the following description and appended claims, with reference had to the attached drawings showing the preferred embodiments of the invention.

DESCRIPTION OF THE PREFERRED EMBODIMENTS

Figure 1:
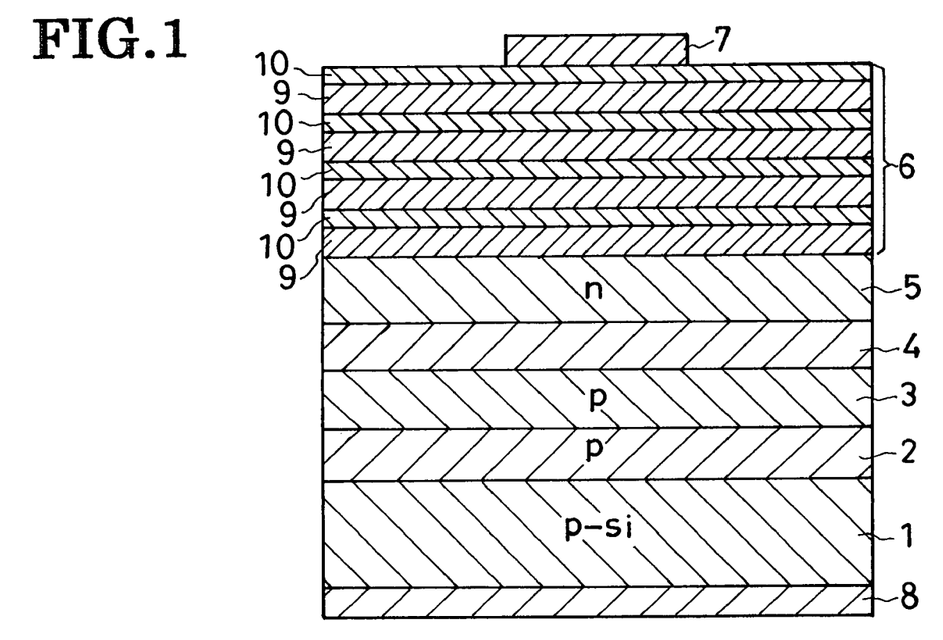
FIG. 1 is a schematic cross section through a preferred form of light emitting diode embodying the principles of this invention.
Figure 2:
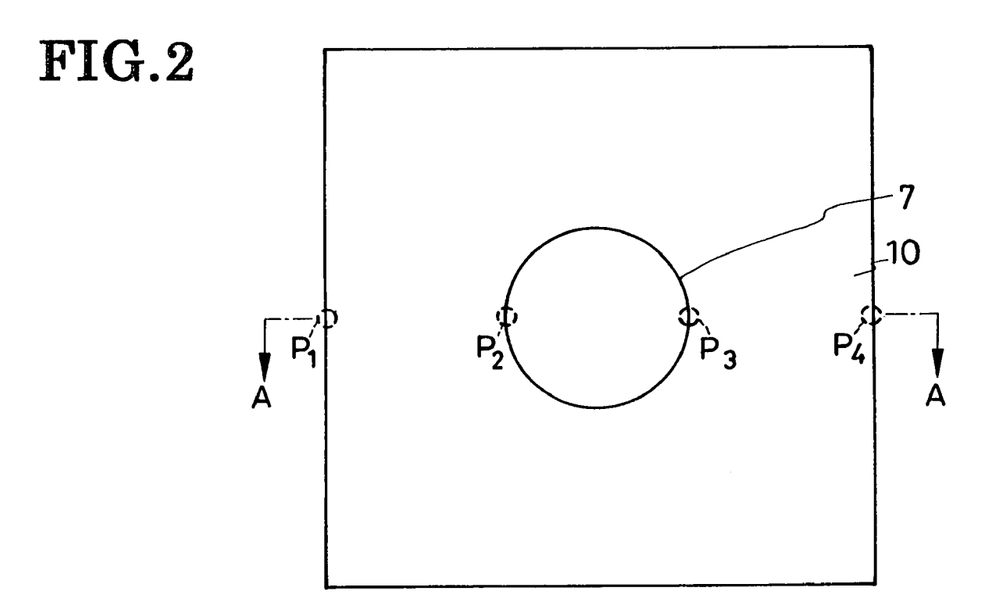
FIG. 2 is a top or front plan of the light emitting diode of FIG. 1.

The present invention is currently believed to be best embodied in the double heterojunctions light-emitting diode (LED) shown in a cross section in FIG. 1 and in a plan view in FIG. 2. The representative LED has a substrate 1 of electrically conductive p-type silicon. Directly overlying the substrate 1 is a buffer layer 2 of p-type nitride semiconductor. On this buffer layer 2 there are successively formed a first compound semiconductor layer 3 of a p-type nitride and a second compound semiconductor layer 5 of an n-type nitride, with an active layer 4 of nitride semiconductor sandwiched therebetween. The second compound semiconductor layer 5 is overlain by an n-type current spreading layer 6 of multiple heterojunctions constituting the gist of this invention. A top, front or first electrode or cathode 7 is arranged on the exposed surface of the current spreading layer 6, and a bottom, back or second electrode or anode 8 on the opposite side of the substrate 1 from the buffer layer 2. The p-type nitride semiconductor layer 3 is called a p-type cladding, and the n-type nitride semiconductor layer 5 an n-type cladding, by some specialists.

The p-type silicon substrate 1 is doped with a p-type or acceptor impurity of boron or other Group III elements to a concentration ranging from $5\times10^{18}$ cm$^{-3}$ to $5\times10^{19}$ cm$^{-3}$. Consequently, the substrate 1 provides a current path between the electrodes 7 and 8, being as low in resistivity as from 0.0001 to 0.0100 ohm-centimeter. The substrate 1 should be sufficiently thick (e.g. from 350 to 500 micrometers) to function as a mechanical support for the overlying layers 2-6.

The buffer layer 2 is of a III-V compound semiconductor containing a p-type or acceptor impurity. Preferably, the buffer layer 2 may be fabricated from a nitride semiconductor expressed by the formula, $Al_aIn_bGa_{1-a-b}$, where a and b are both equal to or greater than zero and less than one. Examples meeting these requirements include aluminum indium gallium nitride (AlInGaN), gallium nitride (GaN), aluminum gallium nitride (AlGaN), and indium gallium nitride (InGaN). The particular buffer layer 2 employed in this embodiment of the invention was of p-type AlInGaN with a thickness of 30 nanometers.

The buffer layer 2 is intended to convey the crystal face orientation of the underlying silicon substrate 1 to the overlying nitride semiconductor layers 3-6. The thickness of the buffer layer should be about 10 nanometers or more in order to perform the buffering function to the full, and about 500 nanometers or less in order to be kept from cracking.

Instead of the illustrated single layer construction the buffer layer 2 could take the form of a lamination of two different sublayers, or of two or more alternations of such sublayers, grown epitaxially one on top of the other. The first of the two buffer sublayers can be fabricated from those nitride compounds which are defined as:

where M is at least either of indium and boron; x is greater than zero and equal to or less than one; y is equal to or greater than zero and less than one; and (x+y) is equal to or less than one. Preferred examples of these nitride compounds include aluminum nitride (AlN), AlGaN, AlInGaN, aluminum boron gallium nitride (AlBGaN), aluminum indium nitride (AlInN), aluminum boron nitride (AlBN), and aluminum indium boron nitride (AlInBN).

The second of the two buffer sublayers can be fabricated from those nitride compounds which are defined as:

where M is at least either of indium and boron; a is equal to or greater than zero and equal to and less than one; b is equal to or greater than zero and less than one; (a+b) is equal to or less than one; and a is less than x in the formula defining the materials for the first of the two buffer sublayers.

Further, notwithstanding the showing of FIG. 1 and the foregoing description, the buffer layer 2 may be omitted if the overlying p-type nitride semiconductor layer 3 is thick enough to perform the functions of the buffer layer.

The p-type nitride semiconductor layer 3 is of a III-V compound semiconductor doped with a p-type impurity. Preferably, the nitride semiconductor layer 3 may be fabricated from a nitride semiconductor expressed by the formula, $Al_xIn_yGa_{1-x-y}N$, where x and y are both equal to or greater than zero and less than one, plus a p-type dopant. Examples of nitrides meeting these requirements include AlInGaN, GaN, and AlGaN. The p-type nitride semiconductor layer 3 employed in this embodiment of the invention was of p-type GaN (both x and y are zero in the formula above). The p-type nitride semiconductor layer of this particular material had a bandgap greater than that of the active layer 4 and a thickness of about 200 nanometers.

The active layer 4 is also fabricated from a III-V compound semiconductor, preferably from any of the nitride semiconductors that can be defined by the formula, $Al_xIn_yGa_{1-x-y}N$, where x and y are both equal to or greater than zero and less than one. The particular material employed in this embodiment is InGaN. There may be provided only one such active layer 4, or it may take the form of the so-called multiple quantum well structure. The active layer may, or may not, be doped with an impurity that determines its conductivity type. The thickness of the active layer is less than that of the p-type nitride semiconductor 5 layer 3 or n-type nitride semiconductor layer 5.

Overlying the active layer 4, the second compound semiconductor layer 5 is of a III-V compound semiconductor, preferably a nitride which is expressed by the formula, $Al_xIn_yGa_{1-x-y}$, where x and y are both equal to or greater than zero and less than one, and which is doped with an n-type impurity. The particular material used in this embodiment is n-type GaN. The n-type nitride semiconductor layer 5 has a bandgap greater than that of the active layer 4 and a thickness of 500 nanometers. Preferably, the thickness of this layer 5 should be in the range of 200-10,000 nanometers and greater than that of the sublayers 9 and 10, yet to be referred to, of the current spreading layer 6. The n-type nitride semiconductor layer 5 in this thickness range will favorably function as a cladding to limit carrier overflow. With the carriers thus effectively contained in the active layer 4, the LED is bound to possess an improved efficiency of light emission.

The p-type nitride semiconductor layer 3, active layer 4, and n-type nitride semiconductor layer 5 all function as the main semiconductor regions of the LED. Grown epitaxially on the silicon substrate 1 via the buffer layer 2, they are all favorable in crystallinity.

Disposed on the n-type nitride semiconductor layer 5 according to the novel concepts of this invention, the n-type current-spreading layer 6 could also be called a contact layer or window layer. The current-spreading layer 6 is a lamination of a plurality or multiplicity of alternations of two sublayers 9 and 10 and so includes a plurality or multiplicity of heterojunctions. The four alternations of the current-spreading sublayers 9 and 10 pictured in FIG. 1 is for simplicity purposes only; in practice, there may be provided from 20 to 60 (40 in this particular embodiment) alternations of such sublayers.

The first current spreading sublayers 9 are fabricated from a III-V compound semiconductor, preferably from a first n-type nitride semiconductor containing aluminum in a first proportion or not containing aluminum at all. The second current spreading sublayers 10 is fabricated from a III-V compound semiconductor having a composition different from that of the first current spreading sublayers 9, preferably from a second n-type nitride semiconductor containing aluminum in a second proportion that is greater than the noted first proportion.

Aside from impurities, the first nitride semiconductors adoptable for the first current spreading sublayers 9 can be expressed as:

where M is at least either of indium and boron; a is equal to or greater than zero and less than one; b is equal to or greater than zero and less than one; and (a+b) is equal to or less than one. Preferred nitrides for fabrication of the first current spreading sublayers 9 include GaN, indium nitride (InN), InGaN, boron nitride (BN), boron gallium nitride (BGaN), boron indium gallium nitride (BInGaN), AlInN, AlGaN, AlInGaN, AlBN, AlBGaN, and aluminum boron indium gallium nitride (AlBInGaN).

The particular material chosen for the first current spreading sublayers 9 in this embodiment of the invention was n-type GaN (both a and b are zero in the formula above). The resulting first current spreading sublayers 9 had a bandgap greater than that of the active layer 4, and each had a thickness of 25 nanometers. A preferred range of thicknesses for the first current spreading sublayers 9 is from 15 to 500 nanometers. The first current spreading sublayers 9 would fail to provide sufficient two-dimensional electron gas if they were less than 15 nanometers thick. If more than 500 nanometers thick, on the other hand, the first current spreading sublayers 9 would absorb so much light that the LED would be adversely affected in efficiency.

Aside from impurities, the second nitride semiconductors adoptable for the second current spreading sublayers 10 can be expressed as:

where M is at least either of indium and boron; x is greater than zero and equal to or less than one; y is equal to or greater than zero and less than one; (x+y) is equal to or less than one; and x is greater than a in the formula above defining the materials for the first current spreading sublayers 9. Preferred nitrides for fabrication of the second current spreading sublayers 10 include AlN, aluminum indium nitride (AlInN), AlGaN, AlInGaN, AlBN, AlBGaN, and AlBInGaN.

Although some nitrides are listed for both first and second current spreading sublayers 9 and 10, it is required that different compounds be used for these sublayers in order for them to create heterojunctions. The second current spreading sublayers 10 are made from a material capable of creasing layers of two-dimensional electron gas as two-dimensional carrier for the first sublayers 9.

The particular material chosen for the second current spreading sublayers 10 in this embodiment of the invention was AlN (x=1; y=0). The resulting second current spreading sublayers 10 had a bandgap greater than that of the active layer 4, and each had a thickness of five nanometers, less than that of each first sublayer 9 but sufficiently thick to provide a quantum-mechanical tunnel effect. A preferred range of thicknesses for the second current spreading sublayers 10 is from 0.5 to 5.0 nanometers. The second current spreading sublayers 10 would fail to provide two-dimensional electron gas layers as required if they were less than 0.5 nanometer thick. If more than 5.0 nanometers thick, on the other hand, the second current spreading sublayers 10 would fail to provide the tunnel effect, gaining in resistivity in their thickness direction.

Both first and second current spreading sublayers 9 and 10 are doped with n-type impurities in this embodiment of the invention. Speaking more broadly, however, either or both of the first and second current spreading sublayers 9 and 10 may, or may not, be so doped.

Constituted of the alternating laminations of the first and second sublayers 9 and 10 capable of generating two-dimensional electron gas, the current spreading layer 6 is highly pervious to the light from the active layer 4. This layer 6 is also notable for its extremely low resistivity both in its thickness direction, normal to its exposed major surface, and in a transverse direction parallel to that surface. The low resistivity of the current spreading layer 6 in its transverse direction is due to the two-dimensional electron gas layers created adjacent those surfaces of the first sublayers 9 which adjoin the heterojunctions between the sublayers 9 and 10.

The top or front electrode or cathode 7 is mounted centrally of, and in ohmic contact with, the topmost sublayer 10 of the current spreading layer 6 which is higher in n-type impurity concentration than the n-type nitride semiconductor layer or cladding 5. The front electrode 7 can take the form of a familiar metal pad for connection to external circuitry. Although the front electrode 7 contacts only a limited central part of the surface of the current spreading layer 6, current will flow through all of the active layer 4 thanks to the current spreading action of this layer 6.

Optionally, as disclosed in Japanese Unexamined Patent Publication No. 2003-197965, supra, a metal annulus or rim may be arranged around the front pad electrode 7 on the surface of the current spreading layer 6 and electrically connected to the electrode 7. Such an electrode appendage can be less in surface area relative to that of the current spreading layer 6 than in the Japanese unexamined patent publication. It is also possible to mount a transparent electrode on the surface of the current spreading layer 6 in addition to the front electrode 7. Furthermore, as required or desired, a contact layer of an n-type nitride semiconductor may be interposed between current spreading layer 6 and front electrode 7 for better ohmic contact.

The back electrode or anode 8 underlies the p-type silicon substrate 1 in ohmic contact therewith. This electrode could be placed in direct contact with the p-type nitride semiconductor layer 3 or with the p-type buffer layer 2.

What follows is a method of making the LED of FIGS. 1 and 2 according to the invention. The p-type buffer layer 2, p-type nitride semiconductor layer 3, active layer 4, and n-type nitride semiconductor layer 5 may be successively formed one on top of the other on the silicon substrate 1 by the known organometallic vapor phase epitaxy (OMVPE).

Then, for creation of the current spreading layer 6, the predetermined proportions of trimethyl gallium gas, ammonia gas, and silane gas ($SiH_4$) may first be introduced into the OMVPE reactor, thereby forming one first current spreading sublayer 9 of GaN on the nitride semiconductor layer 5. Then the prescribed proportions of trimethyl aluminum gas, ammonia gas and $SiH_4$ may be charged into the same OMVPE reactor, thereby forming one second current spreading sublayer 10 of AlN on the first current spreading sublayer 9. These steps of creating one first current spreading sublayer 9 and one second current spreading sublayer 10 may be repeated a required number of times to form as many alternations of the sublayers 9 and 10 constituting in combination the current spreading layer 6. The LED can be completed as the electrodes 7 and 9 are subsequently formed on the opposite surfaces of the chip.

The LED constructed and fabricated as in the foregoing gains the following advantages:

1. Constituted of an alternating lamination of sublayers 9 and 10, the n-type current spreading layer 6 contains a plurality or multiplicity of heterojunctions, with two-dimensional electron gas or carrier layers created contiguous to such junctions. As a consequence, the current spreading layer 6 is very low in resistivity in a plane parallel to its major surfaces and so permits greater amounts of current to flow through those parts of the active layer 4 which are out of register with the front electrode 7.

Figure 3:
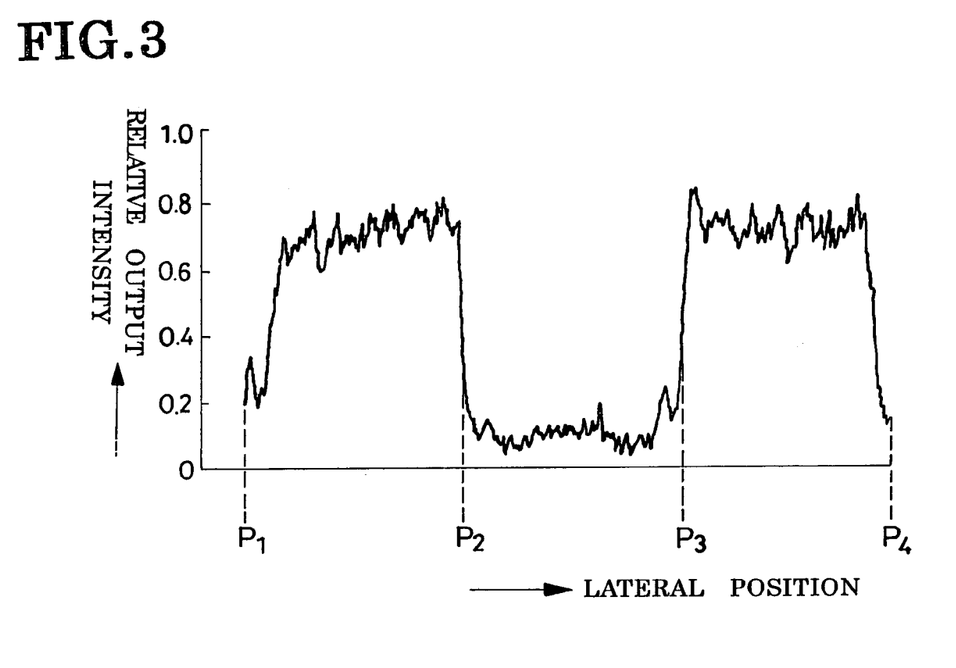
FIG. 3 is a graph plotting the distribution of output light intensity in a side-to-side lateral direction of the light emitting diode of FIGS. 1 and 2.

2. As graphically represented in FIG. 3, the resulting distribution of light intensity from the front surface of the LED is approximately equal at zones $P_1$-$P_2$ and $P_3$-$P_4$ on opposite sides of the front electrode 7.

3. The prior art annular electrode appendage can be either totally removed or greatly reduced in size for elimination or diminution of its interference with the light to be emitted.

4. The provision of the prior art transparent cladding under the front electrode is also unnecessary in order to avoid the noted unavoidable absorption of light by the cladding.

5. The current spreading layer 6 of multiple sublayer construction with the two-dimensional electron gas effect according to the invention is capable of performing the current spreading function just as favorably as the prior art current spreading layer having no sublayers, even if the current spreading layer according to the invention is made less in thickness than the prior art. As a result, for obtaining a given degree of current spreading effect, light absorption and voltage drop by the current spreading layer according to the invention can be made less than by the prior art.

6. Being higher in impurity concentration than the n-type nitride semiconductor layer 5, the current spreading layer 6 according to the invention doubles as a contact layer, permitting the front electrode 7 to be mounted directly in ohmic contact therewith.

7. Containing a great deal of carriers, the current spreading layer 6 permits the front electrode 7 to be mounted in direct contact therewith with minimal resistance.

8. The current spreading layer 6 is easily and quickly created in gaseous phase following the formation of the p-type buffer layer 2, p-type nitride semiconductor layer 3, active layer 4 and n-type nitride semiconductor layer 4, without adding substantively to the manufacturing costs of the LEDs.

Figure 4:
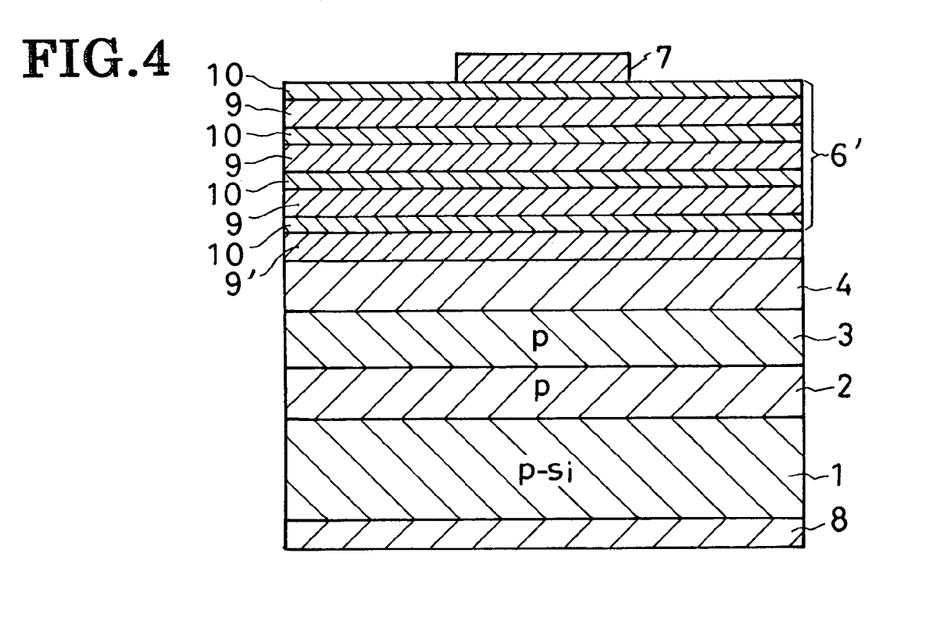
FIG. 4 is a schematic cross section through another preferred form of light emitting diode according to the invention.

Embodiment of FIG. 4

Another preferred form of LED shown in FIG. 4 is akin to that of FIGS. 1 and 2 except for the absence of the n-type nitride semiconductor layer 5. Formed on the active layer 4 in lieu of the missing n-type nitride semiconductor layer 5 is an n-type nitride semiconductor layer 9' which is of the same composition as the first sublayers 9 of the current spreading layer. This current spreading layer is generally designated 6' in FIG. 4 because of the absence of the lowermost first sublayer 9.

Thus the n-type nitride semiconductor layer 9' is in contact both with one second sublayer 10 of the current spreading layer 6' in order to offer the two-dimensional electron gas effect, and with the active layer 4 in order to function as n-type cladding like the n-type nitride semiconductor layer 5 of the FIGS. 1 and 2 embodiment. The current spreading layer 6' is similar in construction to its FIG. 1 counterpart 6 except for the absence of the lowermost first sublayer 9. The lowermost sublayer of the FIG. 4 current spreading layer 6' is the second sublayer 10.

The second preferred form of LED gains the same advantages as does the first, being equipped with the current spreading layer 6' possessing the two-dimensional electron gas effect explained above.

Figure 5:
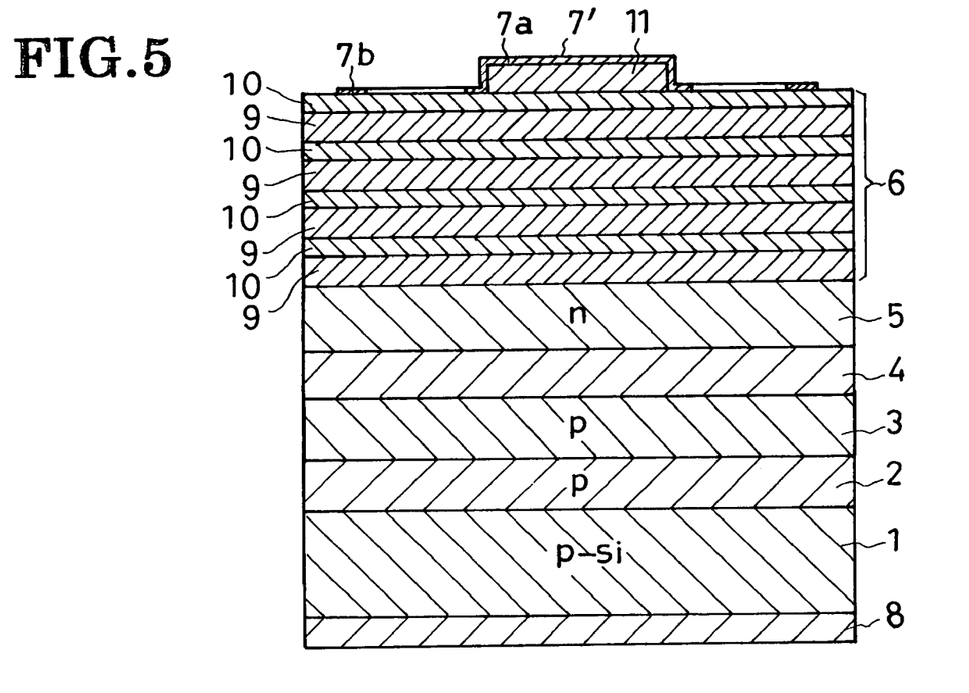
FIG. 5 is a schematic cross section through still another preferred form of light emitting diode according to the invention.

Embodiment of FIG. 5

FIG. 5 shows still another preferred form of LED according to the invention, which features a modified front electrode 7' and a current blocking layer 11 under part of this electrode. The other details of construction are as set forth above with reference to FIGS. 1 and 2.

The modified front electrode 7' comprised a raised core $7_a$ in the shape of a circular piece of sheet metal, and an annular rim $7_b$ loosely surrounding and electrically connected to the core. The current blocking layer 11, which is of either an insulator or a semiconductor with a conductivity type opposite to that of the current spreading layer 6, is interposed between the current spreading layer 6 and the core $7_a$ of the front electrode 7'. More or less circular in shape, the rim $7_b$ is mounted directly on the surface of the current spreading layer 6 in ohmic contact therewith.

Although the LED with the current spreading layer 6 according to the invention inherently assures satisfactory current flow adjacent the periphery of the active layer 4, the annular rim $7_b$ of the electrode 7' around the current blocking layer 11 serves for more favorable current flow in the neighborhood of the active layer periphery. The electrode rim $7_b$ can, however, be less in size than that of the Japanese unexamined patent application cited above for light emission with given intensity because the instant invention does not solely rely upon the electrode rim for promotion of current flow in the adjacency of the active layer periphery.

Optionally, a contact layer of an n-type nitride semiconductor may be interposed between current spreading layer 6 and electrode rim $7_b$ for improvement of ohmic contact therebetween. A current blocking layer similar to that designated 11 could be positioned closer to the p-type semiconductor layers 2 and 3. Such a layer would serve the better purpose of current blocking than when placed just under the electrode core $7_a$, because it would be less susceptible to the influence of current spreading by the current spreading layer 6. The current blocking layer 11 could be of a semiconductor that is opposite in conductivity type to that of the neighboring semiconductor layer.

Figure 6:
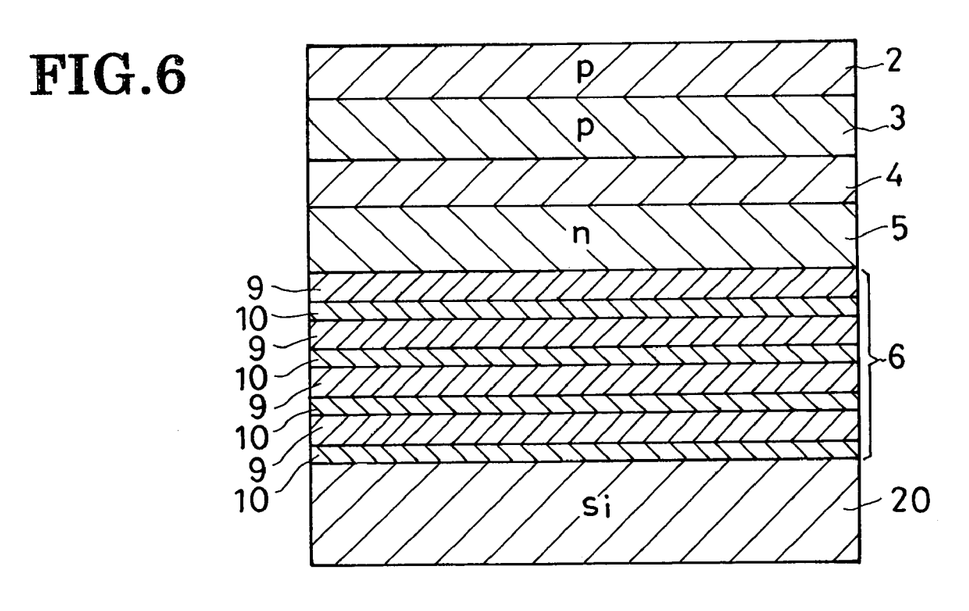
FIG. 6 is a schematic cross section through a product of steps during fabrication of a further preferred form of light emitting diode according to the invention.
Figure 7:
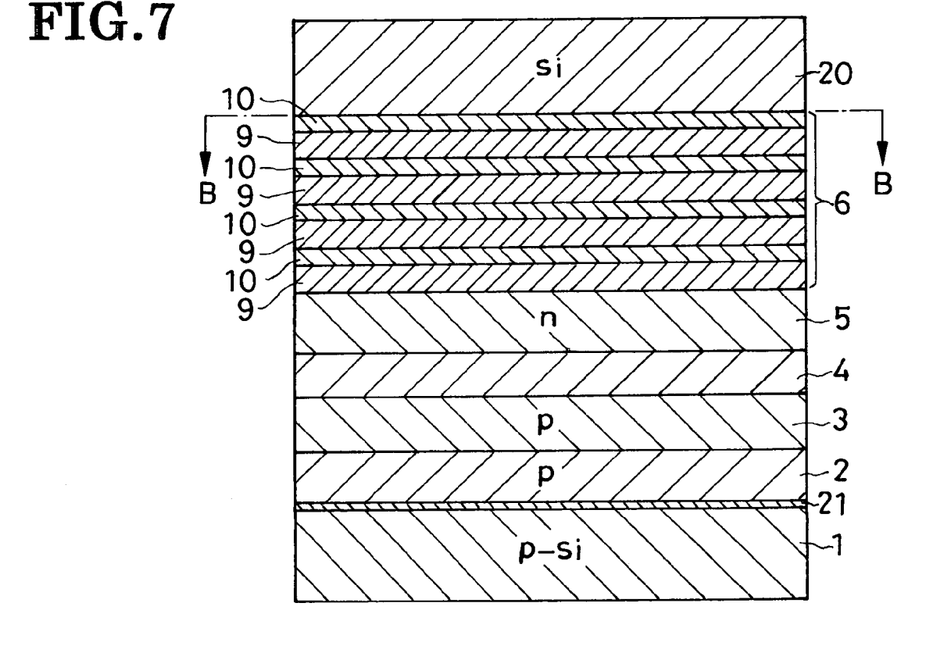
FIG. 7 is a schematic cross section through a product of additional steps during the fabrication of the light emitting diode of FIG. 6.

Method of LED Fabrication (FIGS. 6 and 7)

FIGS. 6 and 7 are explanatory of an alternate method of making the LED according to the invention. There may be first prepared a growth substrate 20 of silicon or the like. The growth substrate 20 is so named because it serves solely for epitaxially growing thereon the various layers hereinafter set forth and is to be removed upon formation of all such layers. On this growth substrate 20 there may be successively formed by the aforesaid OMVPE method the current spreading layer 6, n-type nitride semiconductor layer 5 (first compound semiconductor layer of a first conductivity type), active layer 4, p-type nitride semiconductor layer 3 (second semiconductor layer of a second conductivity type), and buffer layer 2, in that order.

The current spreading layer 6 is a lamination of several alternations of the sublayers 9 and 10. One sublayer 10 is first formed on the growth substrate 20, and one sublayer 9 is then formed on the sublayer 10. The same process of creating another sublayer 10 on one preformed sublayer 9, and another sublayer 9 on the sublayer 10 just formed, is then repeated a required number of times.

A comparison of FIG. 6 with FIG. 1 will reveal that the layers 2-6 in FIG. 6 have been formed on the growth substrate 20 in reversal of the arrangement of the corresponding layers on the substrate 1 in FIG. 1. The n-type nitride semiconductor layer 5 (first compound semiconductor layer) of FIG. 6 functions like the n-type nitride semiconductor layer 5 (second compound semiconductor layer) of FIG. 1. The p-type nitride semiconductor layer 3 (second compound semiconductor layer) of FIG. 6 functions like the p-type nitride semiconductor layer 3 (first compound semiconductor layer) of FIG. 1. The sublayers 9 and 10 of the FIG. 6 current spreading layer 6 are so designated because they function respectively like the correspondingly labeled sublayers 9 and 10 of the FIG. 1 current spreading layer 6. Formed directly on the silicon substrate 20, the current spreading layer 6 as a whole functions as a buffer region in epitaxially growing the overlying layers 2-5, serving to improve their crystallinity and levelness.

Next comes the process of bonding to the topmost p-type buffer layer 2 a p-type silicon substrate 1, FIG. 7, which has been prepared separately. This substrate 1 will be hereinafter referred to as the support substrate in contradistinction from the growth substrate 20. For bonding the support substrate 1 to the p-type buffer layer 2, a bond layer of gold or like metal is first formed as by sputtering on the still exposed major surface of the buffer layer. The metal from which this bond layer is made must be capable of functioning as a bond under heat and pressure. Then a similar bond layer is formed on one of the opposite major surfaces of the support substrate 1. Then this support substrate 1 is held against the p-type buffer layer 2 via the bond layers on their meeting surfaces and joined thereto under heat and pressure.

FIG. 7 shows the support substrate. 1 and buffer layer 2 thus joined together via the junction layer 21 constituted of the bond layers noted above. Notwithstanding the foregoing description the creation of the bond layers on the surfaces of both support substrate 1 and buffer layer 2 is not a requirement; instead, only one such layer could be formed on either of the support substrate 1 and buffer layer 2. Alloys and other bondable conductors could also be used for cementing the support substrate 1 and buffer layer 2.

Then the growth substrate 20 is removed from the current spreading layer 6, along the plane indicated B-B in FIG. 7. The growth substrate 20 could, however, be removed before the support substrate 1 is joined to the buffer layer 2. An LED of substantially the same construction as that of FIG. 1 is completed as a front electrode (shown at 7 in FIG. 1) and back electrode (at 8 in FIG. 1) are formed respectively on the current spreading layer 6 and silicon substrate 1.

This alternate method of fabrication is recommendable in that the current spreading layer 6 of the multiple sublayers 9 and 10 serves as buffer in epitaxially growing the p- and n-type nitride semiconductor layers 3 an 5 and active layer 2. These overlying layers are therefore highly favorable in crystallinity and levelness. Being similar in construction to the FIG. 1 device, the LED itself produced by this alternate method gains the same advantages therewith. The p-type silicon substrate 1, FIG. 7, is of course replaceable by that of n-type silicon or sheet metal.

Figure 8:
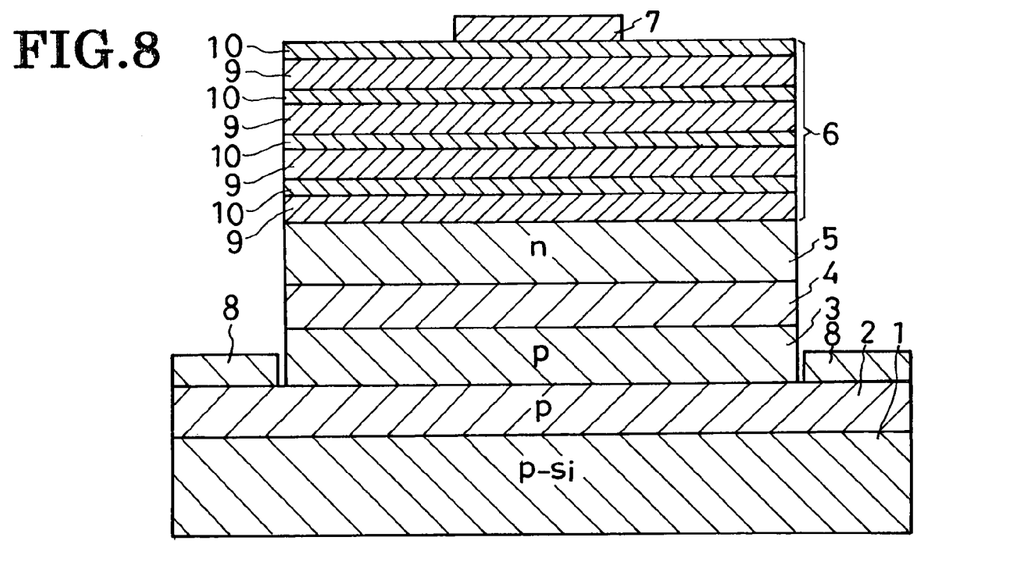
FIG. 8 is a schematic cross section through a yet further preferred form of light emitting diode according to the invention.

Embodiment of FIG. 8

A further preferred form of LED shown in FIG. 8 is akin in construction to that of FIG. 1 except that the second electrode 8 makes direct contact with the p-type buffer layer 2. In order to make this contact possible, the buffer layer 2 has its peripheral portion projecting laterally beyond the edges of the overlying layers 3-6. The second electrode 8 is annular in shape and overlies the annular ledge thus created by the marginal edge portion of the buffer layer 2.

The arrangement of the second electrode 8 along the periphery of the buffer layer 2 leads to a greater amount of current flowing adjacent the periphery of the active layer 4 and eventually to a higher efficiency of light production. Having the laminar current spreading layer 6, this LED possesses all the advantages of the FIG. 1 device. There is no need for current flow in the substrate 1 of the FIG. 8 LED, so that the substrate may be fabricated from an insulator such as sapphire.

POSSIBLE MODIFICATIONS

Notwithstanding the foregoing detailed disclosure it is not desired that the present invention be limited by the exact showing of the drawings or the description thereof. The following is a brief list of possible modifications, alterations or adaptations of the illustrated embodiments which are all believed to fall within the scope of the invention:

1. Either or both of the p-type nitride semiconductor layer 3 and n-type nitride semiconductor layer 5 could be a lamination of two or more nitride semiconductor sublayers of different compositions.
2. The p-type buffer layer 2 could also be a lamination of two or more nitride semiconductor sublayers of different compositions.
3. Third sublayers could be added to the current spreading layer 6 for further enhancement of the two-dimensional carrier gas effect.
4. The p-type buffer layer 2, p-type nitride semiconductor layer 3, active layer 4, n-type nitride semiconductor layer 5 and current spreading layer 6 could be fabricated from other compound semiconductors such as those containing Group V elements (e.g. phosphorus) other than nitrogen and Group III elements.
5. All the LED layers in all the illustrated embodiments might be reversed in conductivity type. Two-dimensional hole gas will generate from the heterojunctions if the current spring layer 6 is of p type.

What is claimed is:

1. A light-emitting semiconductor device of improved efficiency, comprising:
    (a) a substrate made from electrically conducting material, the substrate having a pair of opposite major surfaces;
    (b) a first compound semiconductor layer of a first conductivity type formed on one major surface of the substrate;
    (c) an active layer of a compound semiconductor on the first compound semiconductor layer;
    (d) a transparent second compound semiconductor layer of a second conductivity type, opposite to the first conductivity type, on the active layer;
    (e) a transparent window layer on the second compound semiconductor layer, the window layer being a lamination of alternating first and second sublayers of different compound semiconductors, each first sublayer of the window layer being from 15 nanometers to 500 nanometers thick, each second sublayer of the window layer being from 0.5 nanometer to 5.0 nanometers thick, wherein each first sub layer of the window layer is fabricated from a nitride semiconductor of the second conductivity type containing aluminum in a first proportion that is equal to or greater than zero, wherein each second sublayer of the window layer is fabricated from a nitride semiconductor containing aluminum in a second proportion that is greater than the first proportion, wherein the compound semiconductors of the alternating first and second sublayers of the window layer are chosen to create two-dimensional carrier gas layers in the first sublayers due to heterojunctions between the first and the second sublayers, wherein each first sublayer of the window layer is less thick than the second compound semiconductor layer, and wherein each second sublayer of the window layer contains an impurity that determines the second conductivity type;
    (f) a first electrode disposed on a part of the window layer so as to permit emission of light radiated from the active layer through the window layer, the first electrode being formed in direct contact with the window layer and comprising a metal pad for connection to external circuitry; and
    (g) a second electrode electrically coupled to the other major surface of the substrate.

2. A light-emitting semiconductor device as defined in claim 1, wherein the second compound semiconductor layer has a bandgap greater than that of the active layer, and a thickness greater than each sublayer of the window layer.

3. A light-emitting semiconductor device as defined in claim 1, wherein each first sublayer of the window layer is made from a nitride semiconductor defined as:

$$Al_aM_bGa_{1-a-b}N$$

where M is at least either indium or boron; a is equal to or greater than zero and less than one; b is equal to or greater than zero and less than one; and the sum of a and b is equal to or less than one, and wherein each second sublayer of the window layer is made from a nitride semiconductor defined as:

$$Al_xM_yGa_{1-x-y}N$$

where M is at least either indium or boron; x is greater than zero, equal to or less than one, and greater than a in the formula of nitride semiconductors for the first sublayer; y is equal to or greater than zero and less than one; and the sum of x and y is equal to or less than one.

4. A light-emitting semiconductor device as defined in claim 1, wherein the first conductivity type is p-type, and the second conductivity type n-type.

* * * * *